United States Patent [19]

Havemann et al.

[11] Patent Number: 4,962,365
[45] Date of Patent: Oct. 9, 1990

[54] INTEGRATED CIRCUIT TRENCH RESISTOR

[75] Inventors: Robert H. Havemann, Garland; Robert H. Eklund, Plano, both of Tex.

[73] Assignee: Texas Instruments Incorporated, Dallas, Tex.

[21] Appl. No.: 330,652

[22] Filed: Mar. 30, 1989

[51] Int. Cl.$^5$ .............................. H01C 1/012
[52] U.S. Cl. ................... 338/306; 338/307; 338/309; 338/314; 427/101; 29/610.1
[58] Field of Search ............... 338/306–314; 427/101–103; 437/52, 918, 98, 33; 357/33, 71, 34, 59 R; 156/625; 29/610.1

[56] References Cited

U.S. PATENT DOCUMENTS 4,728,623  3/1988  Lu et al. ........................ 487/52
4,782,030  11/1988  Katsumata et al. .................. 437/33

Primary Examiner—Bruce A. Reynolds
Assistant Examiner—Marvin Lateef
Attorney, Agent, or Firm—James T. Comfort; Melvin Sharp; Douglas A. Sorensen

[57] ABSTRACT

A resistor (10) includes a resistive filling (28) formed within a trench (12) and separated therefrom by an insulating layer (26). Resistive filling (28) is of the same type of semiconductor material as that of second layer (22), but of an opposite extreme of dopant concentration. A head region (32) may be formed below interface (30) within second layer (22) to more clearly delineate the edge of resistive filling (28) from second layer (22). Where resistive filling (28) is of a low dopant concentration, low resistance contact region (34) is formed of a high dopant concentration in order to provide a minimum resistance contact to resistive filling (28).

11 Claims, 1 Drawing Sheet

INTEGRATED CIRCUIT TRENCH RESISTOR

RELATED APPLICATION

This Application is related to co-pending application for U.S. patent Ser. No. 333,159, filed contemporaneously herewith, entitled "Extended Length Trench Resistor."

TECHNICAL FIELD OF THE INVENTION

This invention relates to integrated circuits, and more particularly to a resistor formed within a trench of an integrated circuit.

BACKGROUND OF THE INVENTION

In integrated circuit fabrication, as in standard circuitry, the resistor is used for a multitude of purposes. As with all integrated circuit components, there is a need to minimize component size. Further, any capacitance associated with the device should normally be minimized.

Under current integrated circuit technology, the typical resistor is formed within a semiconductor layer by diffusing a dopant of one type into a region of semiconductor material of opposite semiconductor type. For example, a P type dopant is implanted into an N type region of semiconductor material and diffused to form a P type resistor. Due to the isotropic nature of diffusion, these devices may consume a great deal of lateral area. Further, the PN junction created by the resistor has a parasitic capacitance which degrades circuit performance.

Therefore, a need has arisen for an integrated circuit resistor which will consume a minimal amount of lateral area within the integrated circuit. Further, a need has arisen for an integrated circuit having substantially reduced capacitance associated therewith.

SUMMARY OF THE INVENTION

In accordance with the present invention, a trench resistor and method of fabrication thereof is provided which substantially eliminates or reduces disadvantages and problems associated with prior integrated circuit resistors.

A resistive element in accordance with the present invention includes a first layer of material having a trench formed therein. A resistive filling, typically of a semiconductor material of a predetermined conductivity type and a first dopant level, is formed within the trench. The resistive filling may alternatively also comprise resistive materials other than semiconductors. A second layer of semiconductor material of the same conductivity type as the filling, but of a different dopant level, is formed adjacent the first layer and in contact with the resistive filling. An insulating region may be formed between the resistive filling and the trench. Further, a head region may be formed at the interface where the second layer contacts the end of the resistive filling. This head region will also comprise a material of the same conductivity type as the second layer but will be of a greater dopant concentration than the second layer. The resistive filling may comprise either a P type or N type material.

The present invention provides the technical advantages of minimizing the lateral area necessary to obtain a given amount of resistance. The substantially vertical structure of the device consumes a minimal amount of lateral area within the integrated circuit. Another technical advantage of the present invention includes reduced capacitance associated with the resistor. By surrounding the resistive filling of the present invention with an insulator, the capacitance associated with the resistor is substantially diminished.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Figure 1:
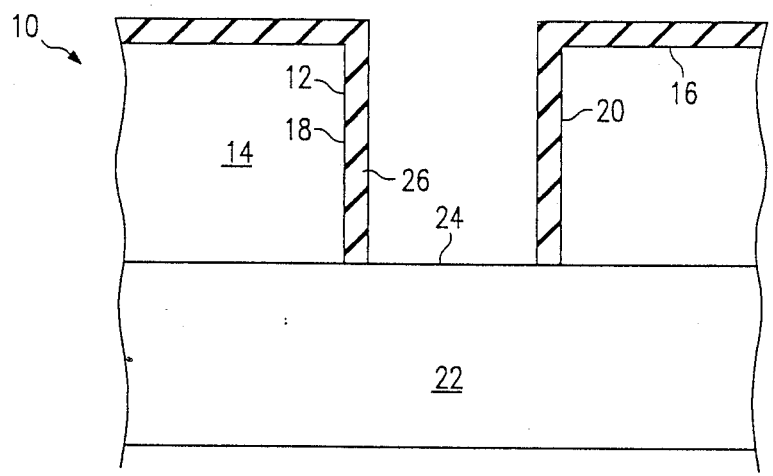
FIG. 1 illustrates a cross-sectional view of a trench formed within a first layer which lies adjacent a second layer.
Figure 2:
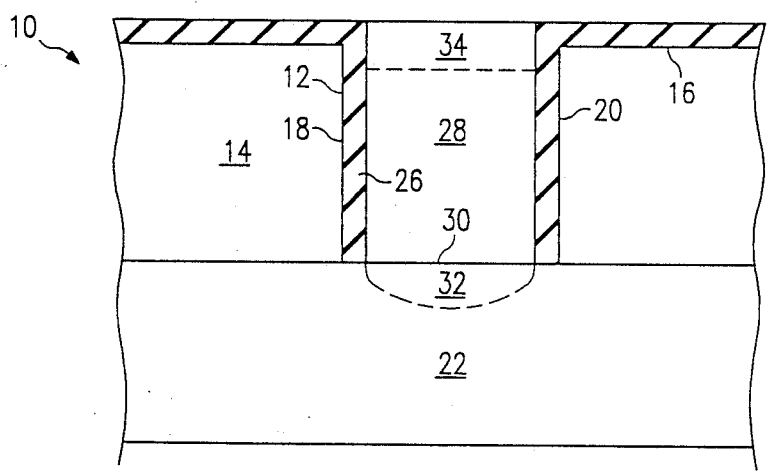
FIG. 2 illustrates a cross-sectional view of a resistive filling formed within the trench illustrated in FIG. 1.

The preferred embodiment of the present invention is best understood by referring to FIGS. 1-2 of the drawings, like numerals being used for like and corresponding parts of the various drawings.

FIG. 1 illustrates a cross-sectional view of the resistor 10 of the present invention after a first processing stage. A trench 12 is formed within a layer 14. In integrated circuit processing, layer 14 typically comprises a layer of semiconductor material such as silicon. Trench 12 is typically etched downwardly from the surface 16 of layer 14. The formation of trench 12 creates sidewalls 18 and 20. Trench 12 is cut to a depth such that it will contact a second layer 22. A bottom edge 24 of trench 12 is created where trench 12 contacts layer 22. There may be a plurality of additional layers (not shown) similar to layers 14 and 22 which lie adjacent thereto. Trench 12 may be cut to any depth in order to contact a particular buried layer. The depth of trench 12 will depend on the width of layer 14 or other layers (not shown) through which trench 12 is cut. In semiconductor processing, these layers are typically on the order of 0.5–1.5 μm in thickness.

Trench 12 may be either round or rectangular around its perimeter. As the dimensions of trench 12 decrease, typically its outer perimeter begins to round, and thus the shape approximates a circle. However, for larger trenches, the shape may be either circular or rectangular. If trench 12 is circular, then only a single "sidewall" will exist therein. The width of trench 12 (or diameter, if circular in shape) is defined as the distance between sidewalls 18 and 20. This width is commonly on the order of 1–3 μm. An insulating layer 26 is formed along sidewalls 18 and 20. Insulating layer 26 may comprise an oxide on the order of 500–2500 angstroms. Insulating layer 26 may be formed by placing an insulating layer over the entire resistor 10 and then etching that layer to expose bottom edge 24. Generally, an insulating layer is used as an etch mask for the trench etch, and as such, remains on surface 16 prior to deposition of insulating layer 26. Thus, an anisotropic etch can be used to expose bottom edge 24 while not completely eroding the insulating layer overlying surface 16. Insulating layer 26 will completely isolate resistive filling 28 (see FIG. 2) from layer 14. As a result, capacitance associated with resistor 10 is minimized. Further, increasing the thickness of insulating layer 26 will reduce the capacitance associated with resistor 10.

FIG. 2 illustrates a cross-sectional view of the preferred embodiment of the present invention. A resistive filling 28 is formed within trench 12. Thus, a vertical resistive path is formed along resistive filling 28 from the area above layer 14 to second layer 22. Resistive filling 28 may comprise a semiconductor material such as silicon. This silicon may be placed within trench 12 by utilizing implantation of undoped polysilicon, a selective epitaxial deposition or an in-situ doped polysilicon layer. Where in-situ processing is used, excess polysilicon will overlie insulating layer 16. This excess polysilicon may be removed by a planar etchback process Resistive filling 28 may alternatively comprise a non-semiconductor resistive material such as a metal. In this instance, second layer 22 will preferably be of a dopant concentration greater than $10^{18}/cm^3$ in order to ensure a good ohmic contact between resistive filling 28 and second layer 22.

The formation of resistive filling 28 creates an interface 30 where resistive filling 28 contacts second layer 22. If resistive filling 28 comprises a semiconductor material, it should comprise the same type of material as that of second layer 22. For example, if second layer 22 were of a P type material, then resistive filling 28 would likewise be of a P type material. However, in order to establish a clear line where resistive filling 28 contacts second layer 22, resistive filling 28 and second layer 22 will be of opposite doping concentration extremes. For example, if second layer 22 will were of a N+ dopant concentration (i.e., greater than $10^{18}/cm^3$ resistive filling 28 would be formed of an N− concentration (i.e. generally between $10^{14}/cm^3$ and $10^{16}/cm^3$). Thus, while resistive filling 28 and second layer 22 comprise like semiconductor materials, they are of opposite dopant concentration extremes. Typical dopants for N type materials include arsenic, antimony and phosphorus. However, phosphorus has a higher tendency to diffuse and therefore, may be undesirable due to the potential redistribution effects created by subsequent high heat process steps which may be associated with the resistor fabrication. Typical dopants for P type materials include boron, gallium or aluminum.

Prior to the formation of resistive filling 28, a head region 32 may be formed below interface 30 and within second layer 22. Head region 32 is formed within second layer 22 and is doped at an opposite concentration extreme in comparison to resistive filling 28, and to even a greater extent than the doping of second layer 22. In other words, if resistive filling 28 were of an N− material, and second layer 22 were of an N+ material, then head region 32 would be of an N++ dopant concentration. By further doping head region 32, the interface 30 between resistive filling 28 and second layer 22 is more clearly defined. Establishing the length of resistive resistive filling 28 is important in that it gives rise to more accurately predicting the resistance thereof. More particularly, resistance is defined by the following equation:

$$R = \frac{(\rho)(l)}{A},$$

Where,
R = resistance,
$\rho$ = resistivity of the resistive material,
l = length of the resistive material, and
A = cross-sectional area of the resistive material.
It may thus be appreciated that where interface 30 is clearly defined, the length of resistive filling 28 will be more readily ascertainable, thus corresponding to a more predictable value of resistance.

Where resistive filling 28 is a lightly doped material (i.e. N− or P−), then it is desirable to form a low resistance contact region 34 at the upper edge of resistive filling 28. This need arises because a low dopant concentration of resistive filling 28 does not readily lend itself to a low resistance ohmic contact thereto. Therefore, a contact region 34 is utilized in order to provide an area which provides an ohmic electrical contact with minimum resistance. Contact region 34 is heavily doped which will effectively provide a low resistance contact area. Conversely, if resistive filling 28 were itself of a high dopant concentration (i.e. P+ or N+), then low resistance contact region 34 would not be necessary because the highly doped material of resistive filling 28 would itself be amenable to a low resistance ohmic contact.

The present invention thus includes a resistive filling 28 formed in a vertical fashion within a trench. As a result, consumption of lateral area within layers 14 and 22 is minimized. Further, insulating layer 26 isolates resistive filling 28 and therefore minimizes capacitance associated therewith. Although the present invention has been described in detail, it should be understood that various changes, substitutions and alterations can be made thereto without departing from the spirit and scope of the invention as further defined by the appended claims.

What is claimed is:

1. A resistor formed in an integrated circuit comprising:
   a substrate having a first conductivity type;
   a trench formed in said substrate extending from a surface of said substrate into said substrate;
   an insulating layer formed on the sidewalls of said trench;
   a buried doped region formed in said substrate at the bottom of said trench, said buried doped region being spaced from said surface and said buried dope region having a second conductivity type opposite to said first conductivity type;
   a resistive filling filling the remainder of said trench and providing a resistive electrical connection between said buried doped region and the surface of said substrate.

2. A resistor as in claim 1 wherein said resistive material comprises polycrystalline silicon.

3. A resistor as in claim 2 wherein said polycrystalline silicon is doped polycrystalline silicon.

4. A resistor as in claim 3 wherein the conductivity type of said polycrystalline silicon is said second conductivity type.

5. A resistor as in claim 1 wherein said resistive material comprises crystalline silicon.

6. A resistor as in claim 5 wherein said crystalline silicon is doped crystalline silicon.

7. A resistor as in claim 6 wherein the conductivity type of said crystalline silicon is said second conductivity type.

8. A resistor as in claim 1 wherein the portion of said buried doped region adjacent to said resistive filling is doped to a higher conductivity level than the remainder of said buried doped region.

9. A resistor as in claim 1 further comprising a silicided region formed at the end of said resistive filing nearest said surface.

10. A resistor as in claim 1 wherein said insulating layer is silicon-dioxide.

11. A resistor as in claim 1 wherein said substrate comprises crystalline silicon.

* * * * *